United States Patent
Lin et al.

(10) Patent No.: US 9,689,935 B2
(45) Date of Patent: Jun. 27, 2017

(54) HALL-EFFECT MEASUREMENT APPARATUS

(75) Inventors: Ming-Cheng Lin, Yilan (TW); Che-Hung Liu, Kaohsiung (TW)

(73) Assignee: Taiwan Semiconductor Manufacturing Company, Ltd., Hsin-Chu (TW)

(*) Notice: Subject to any disclaimer, the term of this patent is extended or adjusted under 35 U.S.C. 154(b) by 704 days.

(21) Appl. No.: 13/250,522

(22) Filed: Sep. 30, 2011

(65) Prior Publication Data
US 2013/0082694 A1    Apr. 4, 2013

(51) Int. Cl.
*G01N 27/72*    (2006.01)
*G01R 33/12*    (2006.01)
*G01R 33/07*    (2006.01)
*G01R 31/26*    (2014.01)
*G01R 15/20*    (2006.01)

(52) U.S. Cl.
CPC ....... *G01R 33/072* (2013.01); *G01R 31/2648* (2013.01); *G01R 15/202* (2013.01)

(58) Field of Classification Search
CPC ............ G01R 31/2648; G01R 31/2831; G01R 15/202; G01R 33/06–33/098; G01R 33/072
See application file for complete search history.

(56) References Cited

U.S. PATENT DOCUMENTS

| | | | | | |
|---|---|---|---|---|---|
| 2,987,669 | A | * | 6/1961 | Kallmann | G01D 5/142 257/422 |
| 4,190,799 | A | * | 2/1980 | Miller | G01R 33/1253 324/228 |
| 4,346,348 | A | * | 8/1982 | Bartoli et al. | 324/750.03 |
| 4,875,839 | A | * | 10/1989 | Sakata et al. | 418/55.2 |
| 5,150,042 | A | * | 9/1992 | Look et al. | 324/754.03 |
| 6,144,040 | A | * | 11/2000 | Ashton | 257/48 |
| 6,605,955 | B1 | * | 8/2003 | Costello et al. | 324/750.09 |
| 7,078,919 | B2 | * | 7/2006 | Prussin | 324/719 |
| 7,538,546 | B2 | * | 5/2009 | Patland et al. | 324/210 |
| 2003/0183509 | A1 | * | 10/2003 | Braeckelmann | 204/192.17 |
| 2004/0110388 | A1 | * | 6/2004 | Yan et al. | 438/710 |
| 2007/0046285 | A1 | * | 3/2007 | Arima | 324/207.2 |
| 2009/0045829 | A1 | * | 2/2009 | Awazu et al. | 324/755 |

OTHER PUBLICATIONS

Standard Test Methods for Measuring Resistivity and Hall Coefficient and Determining Hall Mobility in Single-Crystal Semiconductors, Active Standard ASTM F76, Aug. 2008.*
Keithley Instruments, Low Level Measurements Handbook 6th Edition. (2004).*

* cited by examiner

*Primary Examiner* — Huy Q Phan
*Assistant Examiner* — Adam Clarke
(74) *Attorney, Agent, or Firm* — Slater Matsil, LLP

(57) ABSTRACT

A Hall-Effect measure apparatus comprises a magnetic source, a wafer on a thermal chuck, a dc current source and a voltage meter. The magnetic source generates a magnetic field in a perpendicular position relative to the wafer. Furthermore, the magnetic field is targeted at a specific region of the wafer to be tested. By performing a Hall-Effect measurement and van der Pauw measurement, the carrier mobility of the specific region of the wafer can be calculated.

19 Claims, 5 Drawing Sheets

HALL-EFFECT MEASUREMENT APPARATUS

BACKGROUND

Since the invention of the integrated circuit, the semiconductor industry has experienced rapid growth due to improvements in the integration density of a variety of electronic components (e.g., transistors, diodes, resistors, capacitors, etc.). This improvement in integration density has come from shrinking the semiconductor process node (e.g., shrink the process node towards the sub-20 nm node). As the demand for miniaturization continues, the further shrinking of the process node may increase the complexity of fabricating integrated circuits and corresponding testing methods.

As semiconductor technologies evolve, wafer testing methods have become more sophisticated. In the semiconductor process, integrated circuits are fabricated on a semiconductor wafer. The semiconductor wafer goes through many processing steps before a plurality of integrated circuits are separated by cutting the semiconductor wafer. Each step of the semiconductor fabrication process may employ a variety of semiconductor tests and measurements to ensure consistent high quality. The variety of semiconductor tests and measurements include measuring carrier mobility and resistivity.

A Hall-Effect measurement is employed to measure the carrier mobility of a wafer. More particularly, when a Hall-Effect measurement is applied to a region of a wafer, a series of voltage measurements are performed with a constant current applied to the region of the wafer. In addition, a constant magnetic field is oriented in a perpendicular position relative to the region of the wafer. The Hall-Effect measurement may further include a second set of voltage measurements by reversing the direction of the magnetic field. In other words, a first set of voltage measurements may be obtained through a positive magnetic field. Likewise, a second set of voltage measurements may be obtained through a negative magnetic field. By employing both a positive magnetic field and a negative magnetic field, a more accurate carrier mobility testing result may be obtained.

The van der Pauw technique is used to determine the resistivity of a region of a wafer. The region may be of a rectangular shape, square shape or the like. The region comprises four corners numbered from 1 to 4 in a counter clockwise order. A dc current is injected between a first corner and a second corner. A voltage is measured across a third corner and a fourth corner. As such, a resistance of the specific region can be determined by using Ohm's law.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, a Hall-Effect measurement apparatus for testing carrier mobility of a wafer. The invention may also be applied, however, to a variety of electrical characterization tests of the wafer.

Figure 1:
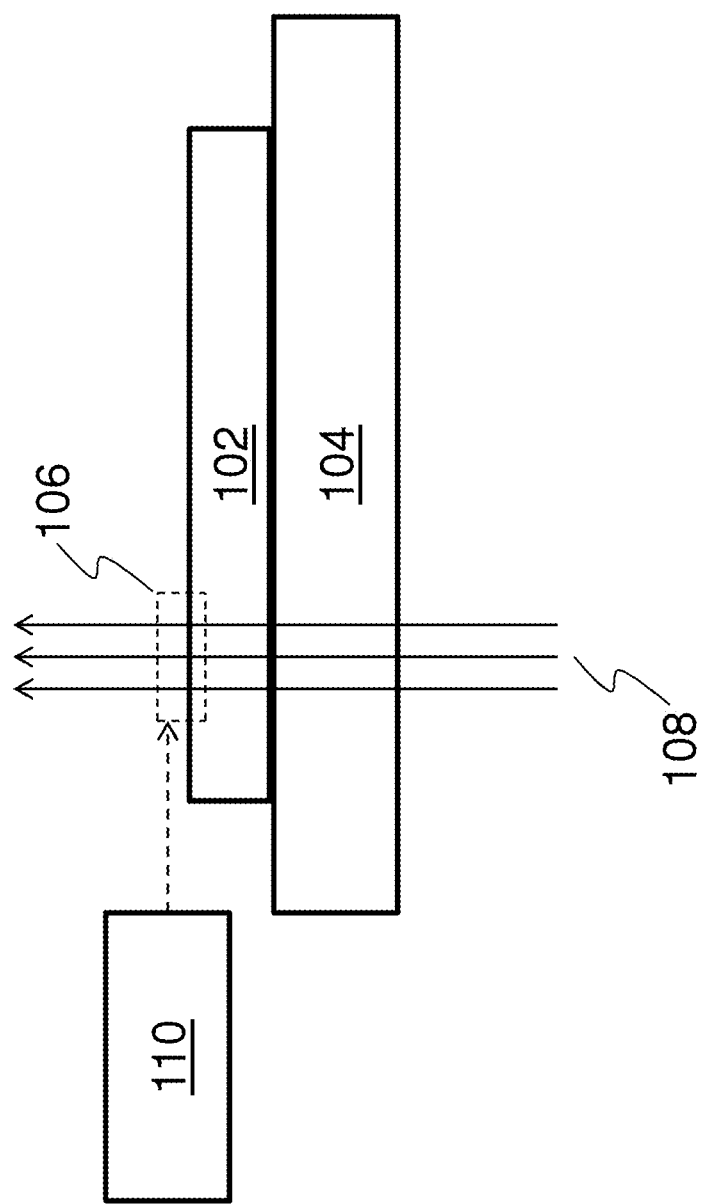
FIG. 1 illustrates a block diagram of a Hall-Effect measurement apparatus in accordance with an embodiment.

Referring initially to FIG. 1, a block diagram of a Hall-Effect measurement apparatus is illustrated in accordance with an embodiment. The Hall-Effect measurement apparatus includes a magnet field 108 oriented in a perpendicular position relative to a wafer 102. More particularly, the magnet field 108 is applied to a specific region 106 to be tested. As shown in FIG. 1, the wafer 102 is supported by a chuck 104. In accordance with an embodiment, the wafer 102 is made of silicon. In addition, the wafer 102 is of a diameter of 12 inches. The chuck 104 is a thermal chuck. Moreover, the chuck 104 is capable of moving the wafer 102 along the X-Y plane (not shown) as well as up and down along the Z-axis (not shown).

A controller 110 is used to adjust the temperature of the specific region 106 through adjusting the temperature of the chuck 104. Furthermore, the controller 110 may be capable of adjusting electrical parameters of the wafer 102. For example, the controller 110 may adjust the gate bias voltage of the wafer 102 if appropriate. The system configuration shown in FIG. 1 is merely an example, which should not unduly limit the scope of the claims. One of ordinary skill in the art would recognize many variations, alternatives, and modifications. For example, the magnetic field 108 can be reversed if appropriate.

Figure 2:
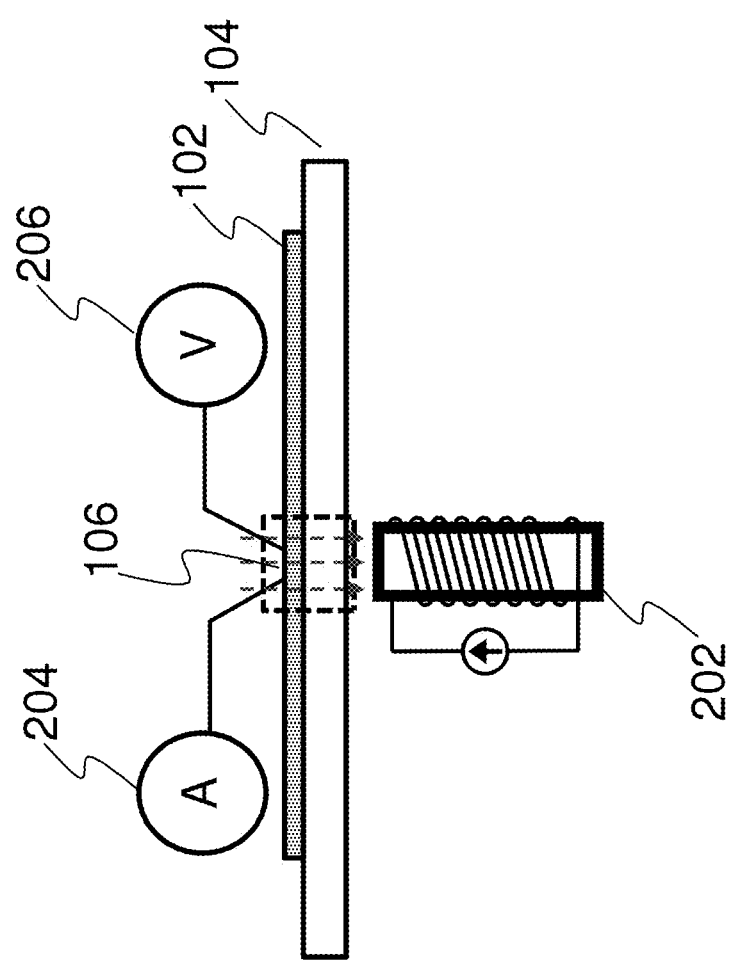
FIG. 2 illustrates a schematic diagram of a Hall-Effect measurement apparatus in accordance with an embodiment.

FIG. 2 illustrates a schematic diagram of a Hall-Effect measurement apparatus in accordance with an embodiment. A wafer 102 is placed on top of a chuck 104. In accordance with an embodiment, the wafer 102 may comprise a plurality of integrated circuits, each of which may occupy a specific region of the wafer 102. In order to characterize the specific region of the wafer 102, an electromagnet device 202 may be placed underneath the chuck 104. It should be noted that while FIG. 2 illustrates an electromagnet device 202, one person skilled in the art will recognize that there may be a variety of implementations of a device generating a magnet field. For example, the electromagnet device 202 can be replaced by a permanent magnet device.

In FIG. 2, a magnet field as indicated by the dashed arrows is generated by the electro-magnet device 202. As shown in FIG. 2, the magnet field is targeted at the specific region 106. More particularly, the magnet field is oriented in a perpendicular position relative to the specific region 106. It should be noted that the configuration of the electromagnet device 202 is merely an example. One person skill in the art will recognize that the electromagnet device 202 can be placed above the wafer 102. Furthermore, the electromagnet device 202 placed above the wafer 102 may provide the same magnet field as that generated by the electro-magnet device 202 placed below the chuck 104 by reversing the direction of the current flowing into the electromagnet device 202.

Furthermore, in accordance with an embodiment, the chuck 104 may be a thermal chuck. As a result, the temperature of the wafer 102 can be adjusted by either increasing or decreasing the temperature of the chuck 104. In addition, a controller as well as auxiliary testing circuits (not shown) may be coupled to the wafer 102 so as to adjust some electrical parameters of the integrated circuits located in the specific region 106.

In accordance with an embodiment, the specific region 106 is planar and square in shape. The specific region 106 may comprise an electrically isolated 2-dimentional (2D) electron gas (2DEG) region, a gated 2DEG region or the like. It is desirable to test the carrier mobility of the specific region 106 under different temperature and gate bias voltage conditions. In particular, the gate bias voltages of the integrated circuits may be adjusted in accordance with the requirements of various testing procedures. For example, a carrier mobility test or a resistivity test may be performed under different gate bias voltages. Alternatively, these tests may be performed under different wafer temperatures. Furthermore, the test may be performed under both temperature and gate voltage variations. As shown in FIG. 2, a current source 204 and a voltage meter 206 are coupled to the specific region 106. The detailed operations of the current source 204 and the voltage meter 206 will be described below with reference to FIG. 3 and FIG. 4.

Figure 3:
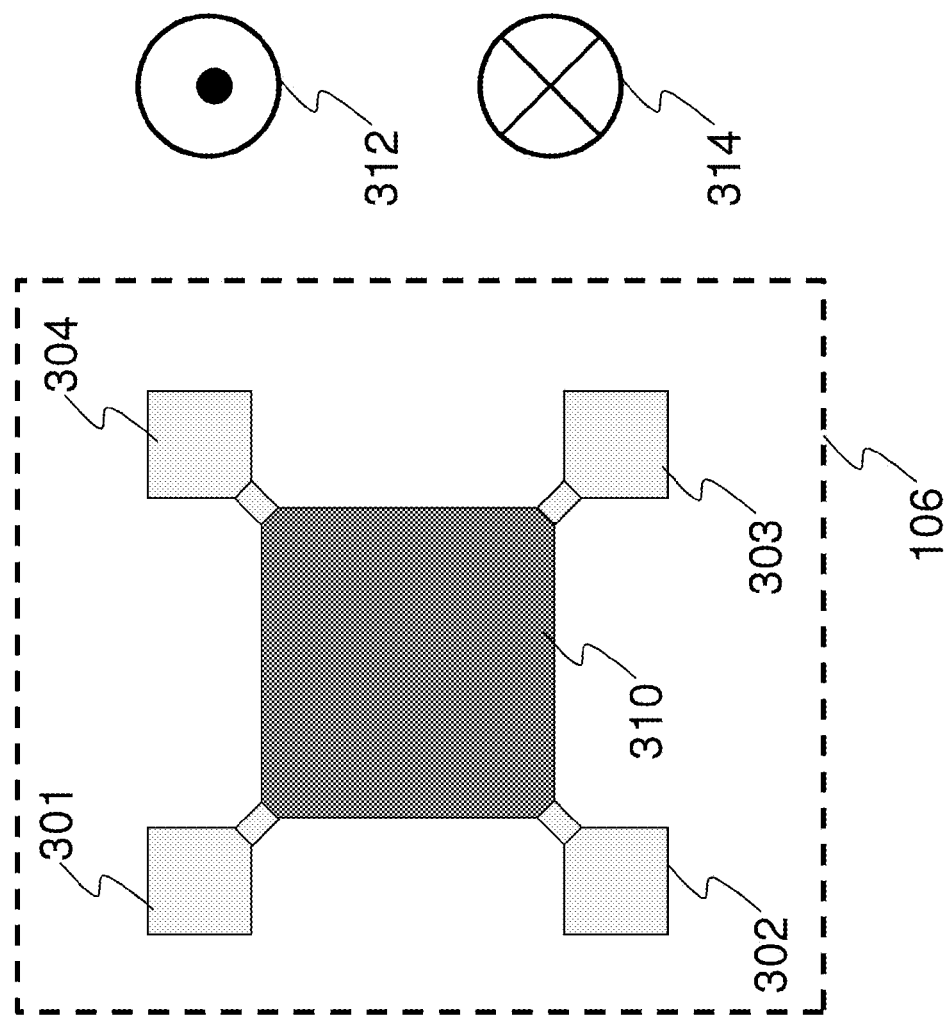
FIG. 3 illustrates a specific region of a wafer under a Hall-Effect measurement in accordance with an embodiment.

FIG. 3 illustrates a specific region of a wafer under a Hall-Effect measurement in accordance with an embodiment. The specific region 106 of the wafer 102 (illustrated in FIG. 2) may comprise a square main body 310 and four corners, namely the first corner 301, the second corner 302, the third corner 303 and the fourth corner 304 (not to scale). In accordance with an embodiment, the specific region 106 is 100 um by 100 um. One skilled in the art will recognize that the shape of the specific region 106 shown in FIG. 3 is merely an example. It is within the scope and spirit of various embodiments for the specific region 106 to comprise other shapes, such as, but no limited to oval, rectangular or circular.

In order to better illustrate the direction of the magnetic field used in a Hall-Effect measurement, a dot 312 and a cross 314 are employed to illustrate the magnetic flux flow direction. According to common practice, a magnetic field having a direction out of a plane such as the main body 310 of FIG. 3 is denoted by a dot (e.g., the dot 312). Likewise, a magnetic field having a direction into the plane such as the main body 310 of FIG. 3 is denoted by a cross (e.g., the cross 314).

In accordance with an embodiment, when a Hall-Effect measurement is performed to calculate the carrier mobility of the square main body 310, a first magnet flux flow indicated by the dot 312 is applied to the square main body 310. Subsequently, a dc current source 204 injects a dc current into the specific region 106. More particularly, the dc current such as 1 mA flows into the first corner 301 and flows out of the third corner 303. The dc current is also referred to as $I_{13}$. At the same time, a voltage meter 206 is coupled between the second corner 302 and the fourth corner 304 so as to measure the voltage across the second corner 302 and the fourth corner 304. The measured voltage is referred to as $V_{24P}$.

Likewise, by reversing the direction of the dc current, a dc current $I_{31}$ flows into the third corner 303 and flows out of the first corner 301. Similarly, a voltage $V_{42P}$ is measured by configuring the voltage meter 206 across the fourth corner 304 and the second corner 302. Similarly, under the same magnetic flux flow, voltages $V_{13P}$ and $V_{31P}$ can be obtained by injecting a dc current between the second corner 302 and the fourth corner 304. The detailed processes of measuring $V_{13P}$ and $V_{31P}$ are similar to that of measuring $V_{24P}$, and hence not discussed in further detail to avoid unnecessary repetition.

In order to improve the accuracy of the Hall-Effect measurement, a second set of measured voltages may be obtained by reversing the direction of the magnetic flux flow. A magnetic flux flow into the plane may be oriented in a perpendicular position relative to the specific region 106. Similar to the steps described above with respect to the previous paragraph, measured voltage $V_{24N}$, $V_{42N}$, $V_{13N}$ and $V_{31N}$ may be obtained by configuring the dc current source 204 to generate dc currents $I_{13}$, $I_{31}$, $I_{42}$ and $I_{24}$ respectively. It should be noted that the first subscript and the second script of the dc current represents the inlet and outlet corners of the dc current respectively.

The sheet carrier density of the specific region 106 can be obtained from the Hall-Effect measurements. A Hall voltage, which is referred to as $V_H$, is obtained using the equation shown below $$V_H = \frac{1}{8} \times (V_{24P} - V_{24N} + V_{42P} - V_{42N} + V_{13P} - V_{13N} + V_{31P} - V_{13N})$$

The sheet carrier density of the specific region 106 can be calculated using the equation shown below $$n_S = \frac{I \times B}{q \cdot |V_H|}$$

where q is the elementary charge, which is $1.602 \times 10^{-19}$ C. B is the flux density of the magnetic flux flow applied to the specific region 106 and I represents the dc current flowing through the specific region 106, which is 1 mA in accordance with an embodiment.

Figure 4:
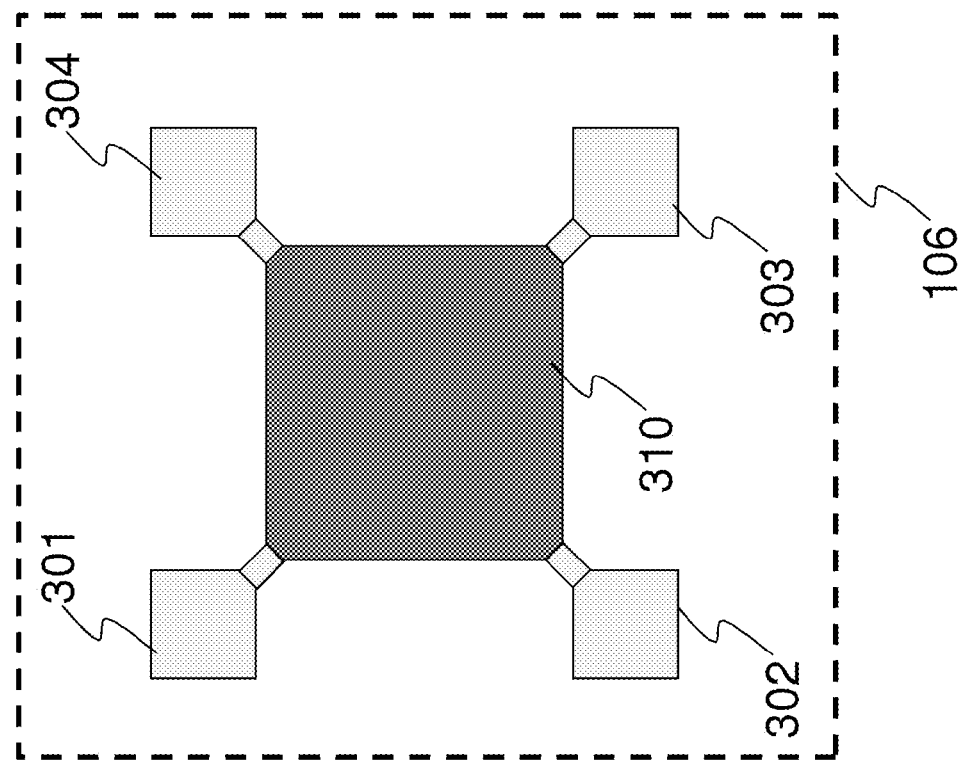
FIG. 4 illustrates a specific region of a wafer under a van der Pauw measurement in accordance with an embodiment.
Figure 4:
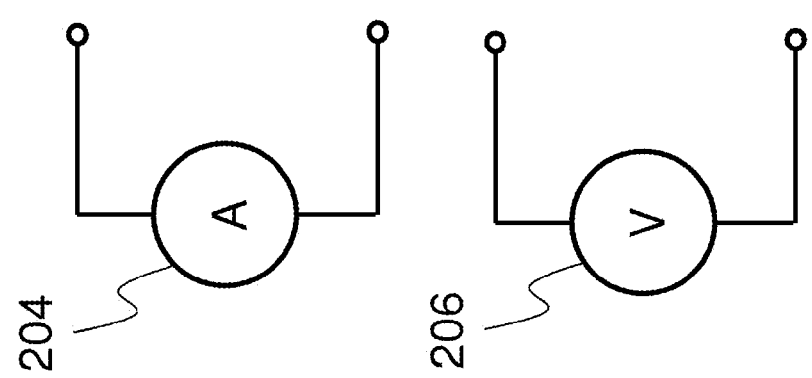

FIG. 4 illustrates a specific region of a wafer under a van der Pauw measurement in accordance with an embodiment. The testing processes of the van der Pauw measurements are similar to the Hall-Effect measurements shown in FIG. 3 except that the magnetic flux flow is not applicable to the van der Pauw measurements. According to an embodiment, the dc current $I_{21}$ of the current source 204 flows into the first corner 301 and flows out of the second corner 302. The voltage meter 206 is applied to the third corner 303 and the fourth corner 304 so as to obtain the measured voltage $V_{34}$. Likewise, the polarity of the current source 204 is reversed so that a dc current $I_{12}$ is injected into the specific region 106 and a voltage $V_{43}$ is measured. According to the principles of the van der Pauw technique, other six values $V_{41}$, $V_{14}$, $V_{12}$, $V_{21}$, $V_{23}$ and $V_{32}$ are obtained. The van der Pauw technique is well known in the art, and hence is not discussed in detail herein.

The resistivity of the specific region 106 can be obtained from the van der Pauw measurements. First, eight values of resistance are obtained using the equations shown below $$R_{1243} = V_{43}/I_{12} \quad R_{2134} = V_{34}/I_{21}$$

$$R_{2134}=V_{34}/I_{21} \quad R_{2134}=V_{14}/I_{23}$$

$$R_{4312}=V_{12}/I_{43} \quad R_{3421}=V_{21}/I_{34}$$

$$R_{1423}=V_{23}/I_{14} \quad R_{4132}=V_{32}/I_{41}$$

Furthermore, two characteristic resistance values are calculated using the equations shown below $$R_A=(R_{2134}+R_{1243}+R_{4312}+R_{3421})/4$$

$$R_B=(R_{3241}+R_{12314}+R_{1423}+R_{4132})/4$$

where $R_A$ and $R_B$ are characteristic resistance for solving the sheet resistance Rs of the specific region 106. Furthermore, the sheet resistance Rs can be calculated by numerically solving the van der Pauw equation shown below $$e^{-\frac{\pi \cdot R_A}{R_S}} + e^{-\frac{\pi \cdot R_B}{R_S}} = 1$$

The carrier mobility of the specific region 106 can be calculated from the following equation $$\mu = \frac{1}{q \times n_S \times R_S}$$

where q is the elementary charge, which is $1.602 \times 10^{-19}$ C. $n_s$ and Rs are the sheet carrier density and sheet resistance of the specific region 106 respectively.

In accordance with an embodiment, by employing the method described above, the Hall-Effect measurement is performed on the specific region 106 with a testing current equal to 1 mA. The sheet resistance Rs is 295.01 ohms. The sheet carrier density of the specific region 106 is $1.054 \times 10^{13}$ electrons/cm². The carrier mobility of the specific region 106 is 2010.82 cm²/V·S. One advantageous feature of having a magnetic field oriented in a perpendicular position relative to the wafer 102 is that the carrier mobility test may be performed under different temperatures, gate bias voltages or any combinations thereof. Furthermore, the carrier mobility testing results under different temperature and gate bias voltage conditions help to investigate the current degradation issue in semiconductor devices.

Figure 5:
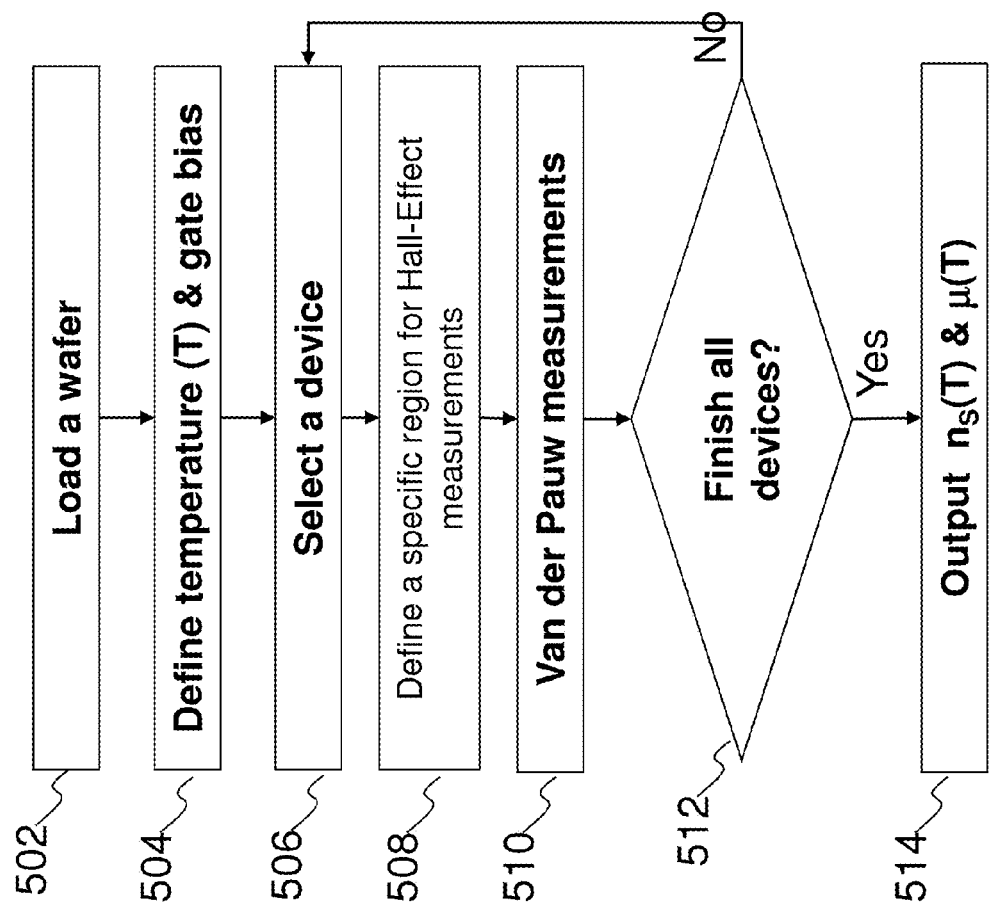
FIG. 5 illustrates a flow diagram of measuring the sheet carrier density and sheet carrier mobility in accordance with an embodiment.

FIG. 5 illustrates a flow diagram of measuring the sheet carrier density and sheet carrier mobility in accordance with an embodiment. At step 502, a wafer 102 is placed on top of a chuck 104. In accordance with an embodiment, the chuck 104 may be a thermal chuck. At step 504, according to the requirements of the sheet carrier mobility test, a controller determines the temperature of the wafer 102 by either increasing or decreasing the temperature of the thermal chuck. In addition, the controller may adjust the gate bias voltages of the integrated circuits of the wafer 102. At step 506, a specific device on the wafer 102 is identified to be tested.

At step 508, a specific region (e.g., specific region 106 shown in FIG. 1) in which the specific device is located is selected to perform the sheet carrier mobility measurement. In addition, a magnetic field is targeted at the specific region and oriented in a perpendicular position relative to the wafer 102. Subsequently, the Hall-Effect measurements are performed on the specific region 106. At step 510, van der Pauw measure measurement is performed on the specific region 106. At step 512, if all specific regions to be tested are fully tested, then step 514 is executed wherein both the sheet carrier density $n_s$ (T) and sheet carrier mobility u(T) are calculated based upon the Hall-Effect measurements and the van der Pauw measurements. On the other hand, if all specific regions to be tested are not fully tested, steps 506, 508 and 510 are repeated until the last specific region is fully tested.

Although embodiments of the present invention and its advantages have been described in detail, it should be understood that various changes, substitutions and alterations can be made herein without departing from the spirit and scope of the invention as defined by the appended claims.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus comprising:
a chuck configured to support a wafer, wherein the chuck is a thermal chuck;
a magnetic field generator configured to generate a magnetic field oriented in a perpendicular position relative to the chuck, wherein the magnetic field is configured to perform a Hall-Effect measurement of a region of the wafer, and wherein the magnetic field is targeted to the region, and wherein the region includes a square main body and four square corner regions outside the square main body, and wherein a magnetic flux flow targeting the square main body is limited within the square main body, and wherein a first square corner region and a second square corner region of the four square corner regions are electrically coupled to a dc current flowing from the first square corner region to the second square corner region; and
a controller configured to adjust operation parameters of the chuck.

2. The apparatus of claim 1, wherein the magnetic field is oriented in a perpendicular position relative to the region.

3. The apparatus of claim 2, wherein:
the controller is configured to adjust a temperature of the wafer; and
the controller is configured to adjust a gate bias voltage of the wafer.

4. The apparatus of claim 2, further comprising:
a dc current source coupled to the wafer; and
a voltage meter coupled to the wafer.

5. The apparatus of claim 2, wherein the magnetic field generator is a permanent magnet configured to:
generate a first magnetic field from a first side of the wafer to a second side of the wafer; and
generate a second magnetic field from the second side of the wafer to the first side of the wafer.

6. The apparatus of claim 1, wherein the magnetic field generator is an electromagnet comprising:
a coil wrapped around a core, wherein an amplitude of the electromagnet is proportional to a dc current flowing into the coil.

7. A system comprising:
a dc current source configured to perform a Hall-Effect measurement;
a voltage meter configured to perform the Hall-Effect measurement;
a chuck having an adjustable temperature range;
a magnetic source configured to generate a magnetic field oriented in a perpendicular position relative to the chuck, and wherein the magnetic field is targeted to a square portion of the chuck, and wherein a magnetic flux flow targeting the square portion is limited within the square portion of the chuck, wherein the dc current source is configured to inject a dc current between a first region over the chuck to a second region over the chuck, and wherein the first region and the second region are adjacent to two diagonally opposite corners of the square portion; and
a controller configured to adjust operation parameters of the chuck.

8. The system of claim 7, further comprising a wafer on top of the chuck, wherein the magnetic field is targeted at a specific region of the wafer and oriented in a perpendicular position relative to the specific region.

9. The system of claim 8, wherein the magnetic source is an electromagnet configured to:
generate a first magnetic field from a first side of the wafer to a second side of the wafer; and
generate a second magnetic field from the second side of the wafer to the first side of the wafer.

10. The system of claim 8, wherein the magnetic source is a permanent magnet configured to:
generate a first magnetic field from a first side of the wafer to a second side of the wafer; and
generate a second magnetic field from the second side of the wafer to the first side of the wafer.

11. The system of claim 7, wherein the controller is configured to:
adjust a temperature setup of the chuck.

12. The system of claim 7, further comprising a calculator configured to calculate carrier density and carrier mobility based upon measurement results from the voltage meter and the dc current source.

13. A method comprising:
configuring a magnetic source to target a specific region of a wafer on a thermal chuck;
configuring the magnetic source to generate a magnetic field in a perpendicular position relative to the specific region, wherein the specific region includes a square main body and four square corner regions outside the square main body, and wherein a magnetic flux magnetic flux flow targeting the square main body is limited within the square main body, and wherein a first square corner region and a second square corner region of the four square corner regions are electrically coupled to a dc current flowing from the first square corner region to the second square corner region, and wherein the first square corner region and the second square corner region are adjacent to two diagonally opposite corners of the square main body;
setting the thermal chuck to a first temperature and setting a gate bias voltage of the specific region to a first voltage level;
performing a first Hall-Effect measurement on the specific region under the first temperature and the first voltage level;
setting the thermal chuck to a second temperature and setting the gate bias voltage of the specific region to a second voltage level, wherein the second temperature is different from the first temperature and the second voltage level is different from the first voltage level;
performing a second Hall-Effect measurement on the specific region under the second temperature and the second voltage level; and
calculating carrier mobility of the specific region.

14. The method of claim 13, further comprising:
performing a van der Pauw measurement on the specific region; and
calculating sheet resistivity of the specific region.

15. The method of claim 13, further comprising:
adjusting a temperature setup of the specific region of the wafer; and
calculating the carrier mobility of the specific region under the temperature setup.

16. The method of claim 13, further comprising:
adjusting the gate bias voltage of the specific region of the wafer; and
calculating the carrier mobility of the specific region under different gate bias voltages.

17. The method of claim 13, further comprising:
in response to a first testing condition, configuring the magnetic source to generate a first magnetic flux flow from a first side of the wafer to a second side of the wafer; and
in response to a second testing condition, configuring the magnetic source to generate a second magnetic flux flow from the second side of the wafer to the first side of the wafer.

18. The method of claim 13, further comprising:
forming the magnetic source using a permanent magnet; and
moving the magnetic source to target the specific region.

19. The method of claim 13, further comprising:
forming the magnetic source using an electromagnet; and
adjusting an amplitude of the electromagnet by adjusting a value of a dc current flowing into a coil of the electromagnet.

* * * * *